(12) United States Patent
Myers et al.

(10) Patent No.: US 7,782,616 B1
(45) Date of Patent: Aug. 24, 2010

(54) HEAT-DISSIPATING COMPONENT HAVING STAIR-STEPPED COOLANT CHANNELS

(75) Inventors: Bruce A. Myers, Kokomo, IN (US); Suresh K. Chengalva, Westfield, IN (US); Darrell E. Peugh, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/428,846

(22) Filed: Apr. 23, 2009

(51) Int. Cl.
*H05K 7/20* (2006.01)
(52) U.S. Cl. .................. 361/699; 361/689; 257/712; 257/714; 165/80.4
(58) Field of Classification Search .................. None
See application file for complete search history.

(56) References Cited

U.S. PATENT DOCUMENTS

| | | | |
|---|---|---|---|
| 4,894,709 A | 1/1990 | Phillips et al. | |
| 5,998,240 A | 12/1999 | Hamilton et al. | |
| 6,055,154 A * | 4/2000 | Azar | 361/688 |
| 6,983,792 B2 | 1/2006 | Dickey et al. | |
| 7,114,550 B2 * | 10/2006 | Nakahama et al. | 165/80.4 |
| 7,139,172 B2 * | 11/2006 | Bezama et al. | 361/699 |
| 7,215,547 B2 | 5/2007 | Chang et al. | |
| 7,227,257 B2 | 6/2007 | Kim et al. | |
| 7,294,926 B2 | 11/2007 | Schubert et al. | |
| 7,427,809 B2 * | 9/2008 | Salmon | 257/773 |
| 7,522,422 B2 * | 4/2009 | Chiba et al. | 361/710 |
| 2006/0022334 A1 | 2/2006 | Myers et al. | |
| 2007/0256810 A1 * | 11/2007 | Di Stefano et al. | 165/46 |

* cited by examiner

*Primary Examiner*—Boris L Chervinsky
(74) *Attorney, Agent, or Firm*—Jimmy L. Funke

(57) ABSTRACT

A heat-dissipating component including a heat-generating device such as a power semiconductor chip and a mounting structure is provided with coolant channels having a stair-stepped internal geometry that enhances cooling performance with both single-phase and two-phase cooling modes without unduly restricting coolant flow or significantly increasing manufacturing cost. The stair-stepped geometry enhances both single-phase and two-phase cooling modes by increasing the surface area of the channels, and further enhances the two-phase cooling mode by providing numerous high-quality bubble nucleation sites along the length of the channels. The stair-stepped channels are formed in the heat generating device and/or the mounting structure, and the stepped sidewalls may extend toward or away from the center of the channel.

7 Claims, 4 Drawing Sheets

HEAT-DISSIPATING COMPONENT HAVING STAIR-STEPPED COOLANT CHANNELS

TECHNICAL FIELD

The present invention relates to a cooling arrangement for a heat-dissipating component including a heat-generating device such as a power semiconductor chip, and more particularly to a heat dissipating component incorporating coolant channels featuring a stair-stepped internal geometry.

BACKGROUND OF THE INVENTION

An effective approach to cooling high power electronic components is to circulate liquid coolant through channels formed in the bulk regions of the semiconductor devices or the heatsinks to which the devices are joined. See, for example, the U.S. Pat. Nos. 4,894,709; 5,998,240; 6,983,792; 7,215,547; 7,227,257; and 7,294,926; and the U.S. Patent Application Publication 2006/0022334. The cooling may be achieved by a single-phase mode in which the liquid coolant remains in the liquid phase, or a two-phase mode in which some or all of the coolant vaporizes as it passes through the coolant channels. Variables such as power density, coolant thermal properties, coolant flow rate, and channel geometry determine whether the cooling process operates in the single-phase mode or the two-phase mode. For purposes of discussion, it will be assumed hereinafter that the thermal properties and flow rate of the coolant are constant.

Various attempts have been made to design the geometry of the coolant channels in order to optimize considerations such as cooling performance, flow restriction and cost of manufacture. But in general, designs developed to optimize one consideration tend to be deficient in respect to one or more other considerations. For example, many designs intended to maximize channel surface area for optimal cooling performance will also undesirably restrict coolant flow and/or be expensive to manufacture. Or cooling channel designs calculated to optimize cooling performance for single-phase cooling processes tend to be sub-optimal when used with two-phase cooling processes, and vice-versa. Accordingly, what is needed is an improved cooling channel design that provides enhanced cooling performance with both single-phase and two-phase cooling processes, without unduly restricting coolant flow or significantly increasing manufacturing cost.

SUMMARY OF THE INVENTION

The present invention is directed to a heat-dissipating component including a heat-generating device such as a power semiconductor chip and mounting structure that is provided with coolant channels having an improved stair-stepped internal geometry that enhances cooling performance in both single-phase and two-phase cooling modes without unduly restricting coolant flow or significantly increasing manufacturing cost. The stair-stepped geometry enhances both single-phase and two-phase cooling modes by increasing the surface area of the channels, and further enhances the two-phase cooling mode by providing numerous high-quality bubble nucleation sites along the length of the channels. The stair-stepped channels are formed in the heat generating device and/or the mounting structure, and the steps may extend toward or away from the center of the channel.

DESCRIPTION OF THE PREFERRED EMBODIMENT

Figure 1:
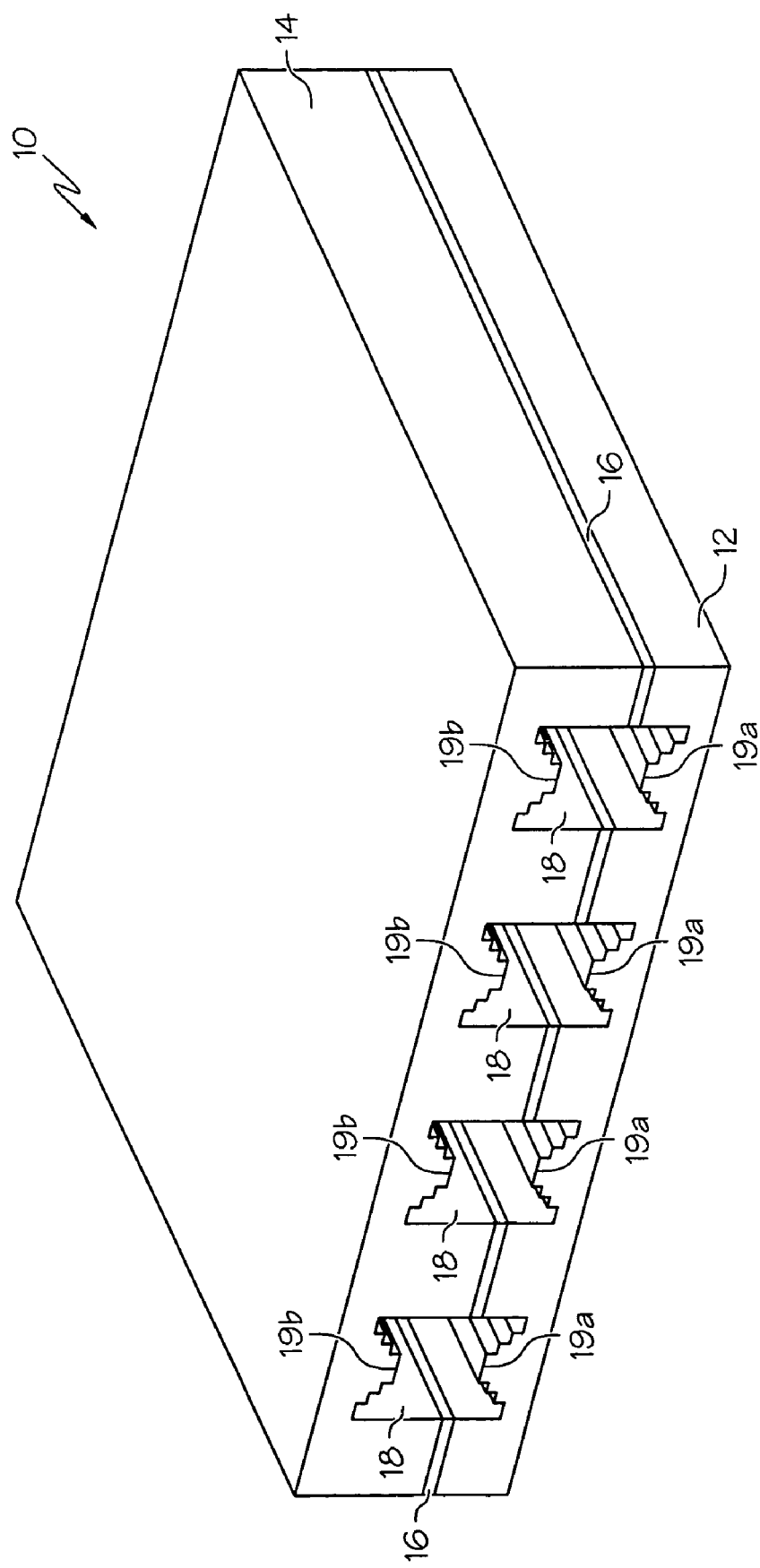
FIG. 1 is an isometric diagram of a liquid-cooled electronic component including a semiconductor device and mounting structure with stair-stepped coolant channels according to this invention.

Referring to the drawings, the reference numeral 10 generally designates a liquid-cooled electronic component according to this invention, including a semiconductor chip 12 and a heatsink 14. In a preferred implementation, the heatsink 14 is formed of copper or another solderable material, and the semiconductor chip 12 is mechanically and thermally joined to it by a layer of solder 16. Of course, the heatsink 14 may be more extensive than shown in order to accommodate additional semiconductor chips if desired. Also, an additional heatsink may be thermally joined to the opposite side of the semiconductor chip 12 in certain applications, a thermally conductive adhesive could be used in place of the solder 16, and the heatsink(s) 14 can be formed of a material that more closely matches the coefficient-of-thermal-expansion (CTE) of the semiconductor chip 12. Moreover, some applications do not require semiconductor chip 12 and heatsink(s) 14 to be physically joined, so long as they are maintained in close proximity. More to the point of the invention, the illustrated electronic component 10 is provided with an array of parallel, linearly-extending coolant channels 18 that conduct a liquid coolant for removing heat generated by semiconductor chip 12.

Figure 2:
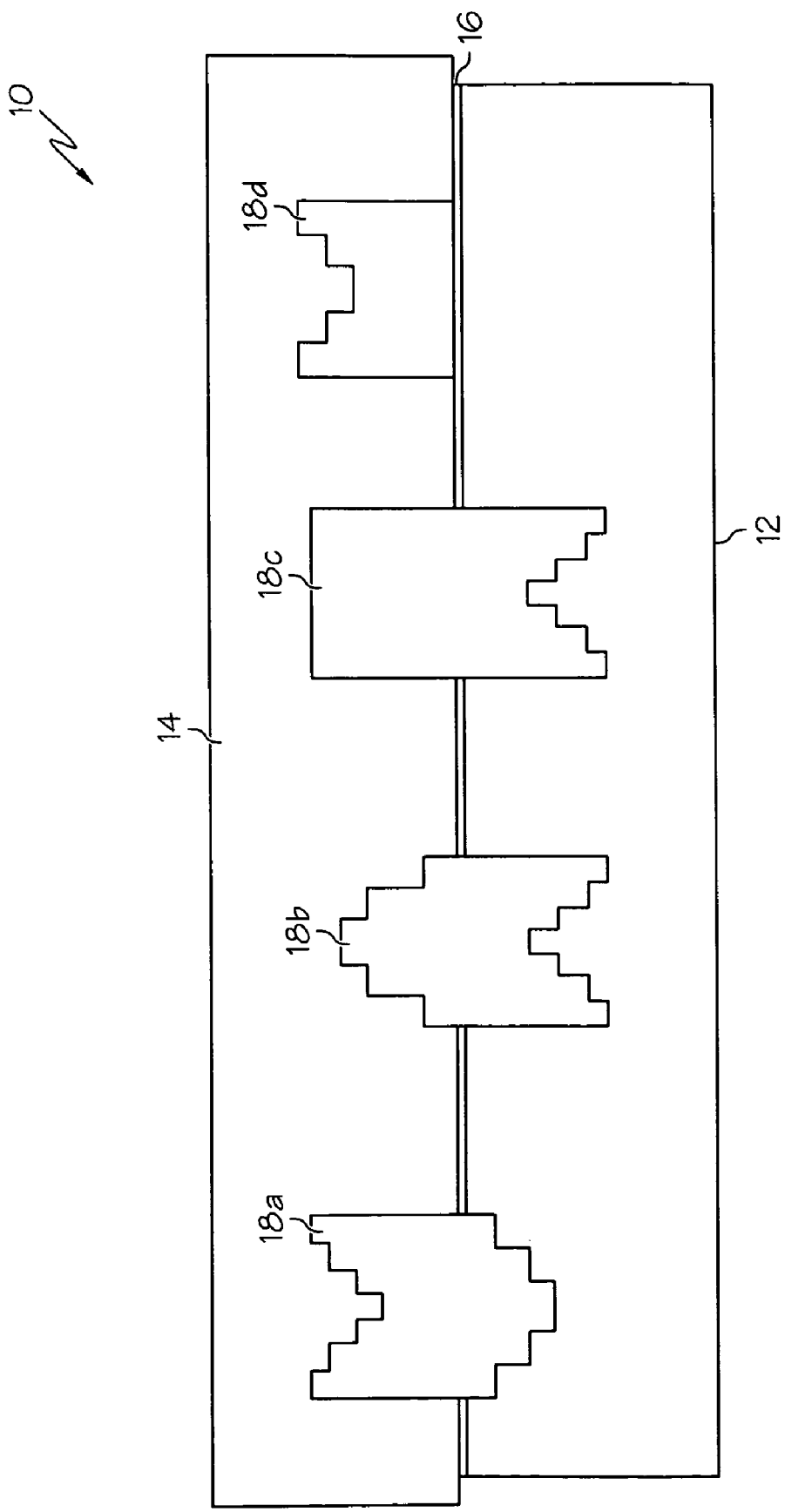
FIG. 2 is a diagram of the liquid-cooled electronic component of FIG. 1, modified to illustrate alternate coolant channel geometries according to this invention.

While the conventional practice in the electronics industry (as demonstrated in the above-referenced patent documents, for example) has been to provide cooling channels that are rectangular in profile, the coolant channels 18 according to the present invention are stair-stepped in profile to provide improved cooling performance as explained below. In the embodiment of FIG. 1, portions of both the semiconductor chip 12 and the heatsink 14 are removed to form the cooling channels 18, and the stair-stepped sidewalls 19a and 19b extend toward the center of the channel 18. Alternate embodiments are depicted in FIG. 2, as designated by the reference numerals 18a-18d. In the embodiment designated by reference numeral 18a, the stair-stepped wall portion formed in the heatsink 14 extends toward the center of the channel, while the stepped wall portion formed in the semiconductor chip 12 extends away from the center of the channel. In the embodiment designated by reference numeral 18b, the stair-stepped wall portion formed in the semiconductor chip 12 extends toward the center of the channel, while the stair-stepped wall portion formed in the heatsink 14 extends away from the center of the channel. In the embodiment designated by reference numeral 18*c*, the stair-stepped wall portion formed in the semiconductor chip 12 extends toward the center of the channel, and the wall portions formed in the heatsink 14 are rectangular in profile. And finally, the by reference numeral 18*d* designates a channel formed entirely in the heatsink 14, where the stair-stepped wall portion extends toward the center of the channel. Of course, various combinations of the depicted channel geometries are possible, even along the length of a single channel, and the channel 18 may be formed entirely in the semiconductor chip 12, if desired.

In general, the component 10 is configured to be mounted in a housing including an inlet manifold upstream of the component for receiving liquid coolant and directing it into the channels 18, and an outlet manifold downstream of the component 10 for receiving and exhausting coolant that has passed through the channels 18. If the coolant enters a channel 18 as a liquid and the channel wall temperature does not significantly exceed the boiling point of the coolant, the coolant will remain in its liquid state; in this case, the cooling mechanism is predominantly convective, and the cooling mode may be characterized as single-phase. However, if the channel wall temperature does significantly exceed the boiling point of the coolant, at least a portion of the coolant will vaporize within the channel 18; in this case, the cooling mechanism is both convective and evaporative, and the cooling mode may be characterized as two-phase.

In general, two-phase cooling performance exceeds single-phase cooling performance until the coolant is completely vaporized, and the composition of the coolant may be selected in relation to the expected channel wall temperatures to optimize component cooling. But in practice, the cooling mode in operation at any given moment depends on several factors such as the temperature of the incoming coolant, the power density in the semiconductor chip 12, and the actual temperature of the channel walls.

Figure 3:
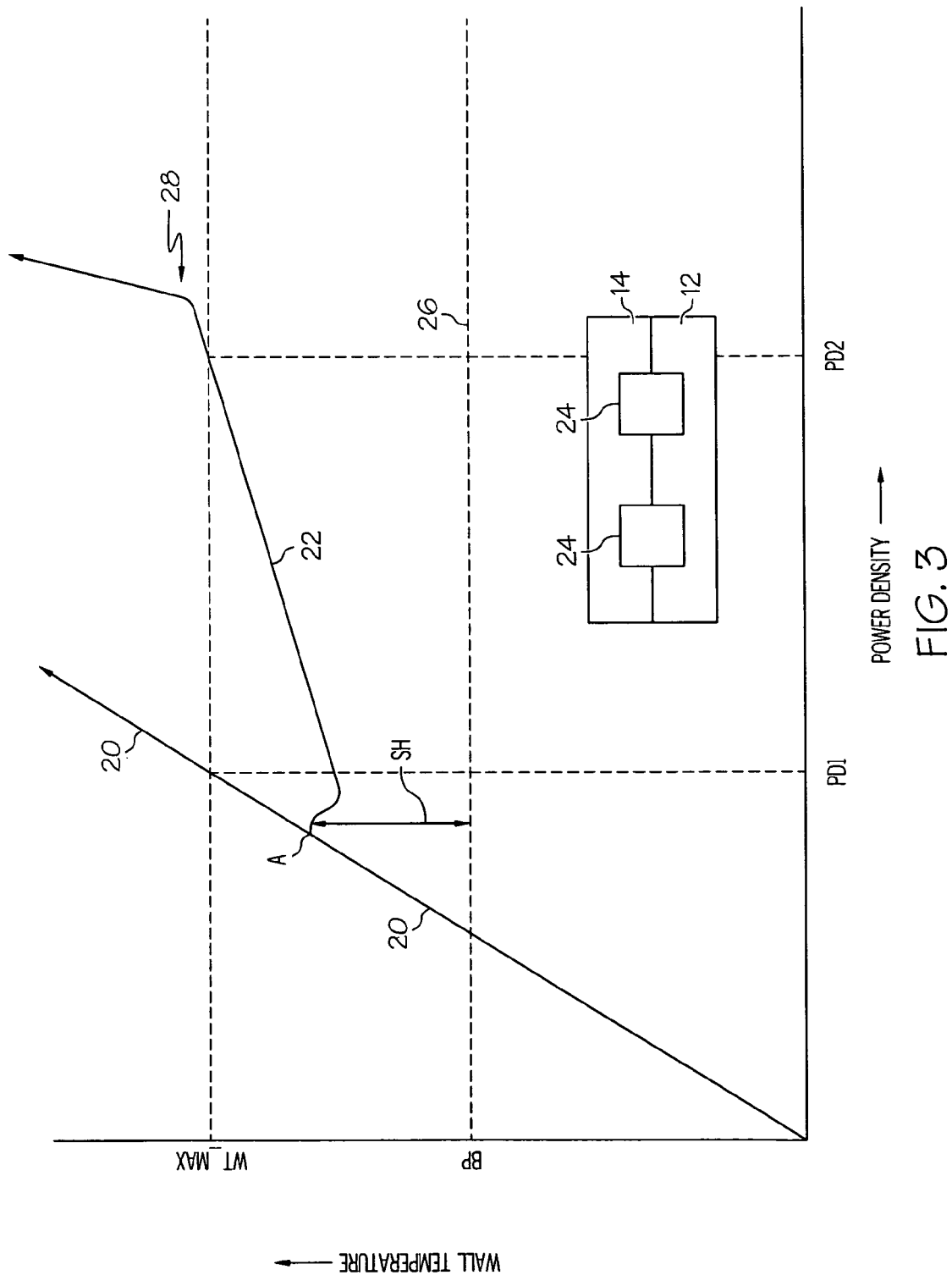
FIG. 3 a graph representing wall temperature vs. power density characteristics for a liquid-cooled electronic component provided with conventional rectangular cooling channels.

The single-phase and two-phase cooling modes described above are graphically represented in FIG. 3 for a component that is provided with conventional rectangular-shaped cooling channels 24. Referring to FIG. 3, the traces 20 and 22 qualitatively depict the rise in coolant wall temperature as the power density within semiconductor chip 12 increases for single-phase and two-phase cooling modes, respectively.

If the boiling point of the coolant is higher than the maximum allowable wall temperature WT_MAX, the coolant will remain in a liquid state to provide single-phase cooling. As indicated by the trace 20, single-phase cooling allows the wall temperature to rise substantially linearly with power density, and the maximum allowable wall temperature WT_MAX is reached when the semiconductor chip power density rises to a limit value PD1.

However, if the coolant has a lower boiling point BP as designated by broken line 26, at least a portion of the coolant will vaporize within the channels 24, and the cooling performance will be improved because a portion of the heat produced by the semiconductor chip 12 is dissipated in the process of vaporizing the coolant. As indicated in FIG. 3, however, vaporization is only initiated when the wall temperature exceeds the boiling point BP by a super-heat temperature SH, as designated by point A on trace 20. Prior to reaching point A, the cooling mode is single-phase, and the trace 22 is coincident with trace 20, but at point A the cooling process transitions from single-phase to two-phase and trace 22 deviates from trace 20. Specifically, the wall temperature initially falls, and then rises with increasing power density, but the increase in wall temperature per unit increase in power density is significantly lower than for single-phase cooling.

As a result, the power density in the semiconductor chip can rise to a much higher limit value PD2 before the wall temperature reaches the maximum allowable wall temperature WT_MAX. Finally, the trace 22 also shows that at some power density level, all of the coolant at the outlet of the coolant channels 24 will be vaporized (i.e., a dry-out condition), and the increase in wall temperature per unit increase in power density rises sharply at this point, as designated by the reference numeral 28. Ideally, the dry-out condition designated by the reference numeral 28 occurs beyond the power density limit value PD2 as shown in order to optimize cooling performance.

As mentioned above, the primary object of the present invention is to improve the cooling performance that is achievable with rectangular coolant channels without unduly restricting coolant flow or significantly increasing manufacturing cost. And as demonstrated below in reference to FIG. 4, the stair-stepped coolant channel geometry of the present invention significantly improves the cooling performance achievable with rectangular coolant channels, thereby allowing the semiconductor chip 12 to operate at higher power densities without exceeding the maximum wall temperature. It is evident from inspection that stair-stepped geometry does not appreciably restrict coolant flow. Moreover, the manufacturing cost is substantially unchanged, as the same manufacturing techniques are used to produce the stepped channels as the conventional rectangular-shaped channels. For example, sawing or etching techniques may be used in the case of the semiconductor chip 12; and sawing, etching, pressing, or extrusion techniques may be used in the case of the heatsink 14.

Figure 4:
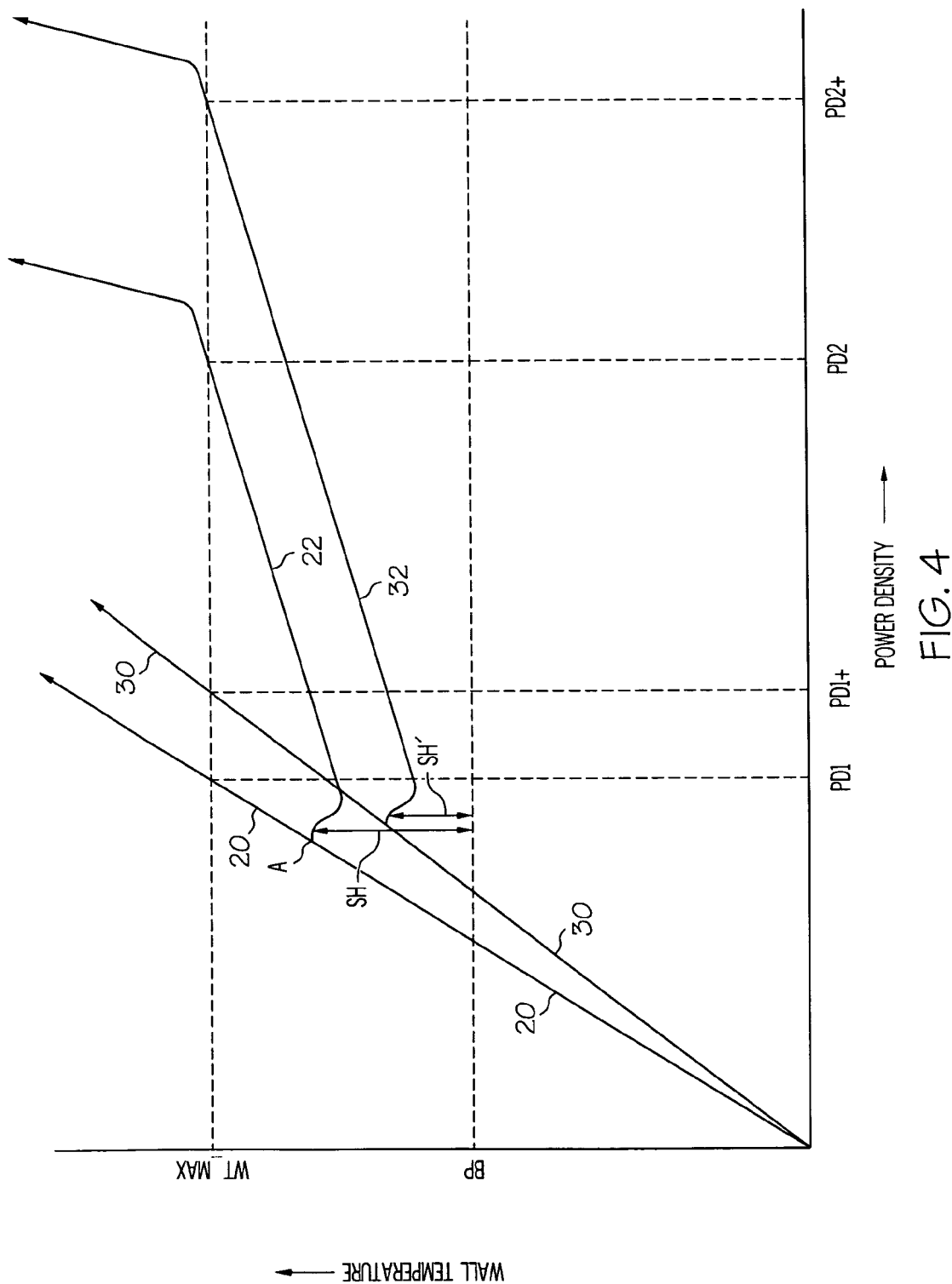
FIG. 4 is a graph comparing wall temperature vs. power density characteristics for the liquid-cooled electronic component of FIG. 1 with an electronic component having conventional rectangular coolant channels.

The graph of FIG. 4 qualitatively illustrates the performance improvement achievable with the stair-stepped coolant channel geometry of the present invention, as compared to that achievable with conventional rectangular-shaped channels. The traces 30 and 32 respectively represent the single-phase and two-phase cooling performances achieved with the stair-stepped coolant channel geometry, and the traces 20 and 22 from FIG. 3 are included for comparison with the traces 30 and 32.

The trace 30 demonstrates that in single-phase cooling, the wall temperature rises substantially linearly with power density, but the rise in wall temperature per unit increase in power density is lower than for a rectangular-shaped channel because the stair-stepped geometry increases the surface area of the coolant channel. Another factor is that the stair-step configurations that extend toward the center of the channel 18 enhance heat transfer into the interior of the channel 18 where the coolant is otherwise not in direct contact with the channel walls. Thus, even when the cooling process is predominantly single-phase, the maximum allowable wall temperature WT_MAX is not reached until the semiconductor chip power density rises to a limit value PD1+ that is significantly higher than the single-phase limit PD1 achievable with rectangular coolant channels.

With respect to two-phase cooling, the trace 32 demonstrates that while the increase in wall temperature per unit increase in power density is similar to that achievable with rectangular coolant channels, the super-heat temperature SH' is substantially reduced compared to the rectangular geometry super-heat temperature SH. Thus, the transition from single-phase cooling to two-phase cooling occurs at a significantly reduced wall temperature, and the maximum allowable wall temperature WT_MAX is not reached until the semiconductor chip power density rises to a limit value PD2+ that is significantly higher than the two-phase limit PD2 achievable with rectangular coolant channels. This surprising reduction in the super-heat temperature is attributable to the stepped channel wall geometry because the steps define multiple high-quality bubble nucleation sites along the length of each channel 18. Studies have shown that bubble formation in the coolant occurs predominantly along inside corners of a coolant channel where the increased sidewall surface area concentrates the heat flow into the coolant. And whereas a rectangular coolant channel has only four inside corners, a stair-stepped coolant channel as described herein can have twelve or more inside corners, as in the embodiment of FIG. 1.

In summary, the present invention provides a coolant channel geometry for a heat dissipating component that significantly enhances cooling performance. Performance enhancement is achieved in both single-phase and two-phase cooling modes so that the cooling performance is improved regardless of the component power density. While the present invention has been described with respect to the illustrated embodiment, it is recognized that numerous modifications and variations in addition to those mentioned herein will occur to those skilled in the art. For example, material properties such as surface roughness and thermal conductivity, coolant properties, and pumping parameters will ordinarily be taken into consideration. Accordingly, it is intended that the invention not be limited to the disclosed embodiment, but that it have the full scope permitted by the language of the following claims.

The invention claimed is:

1. A heat dissipating component comprising:
a heatsink;
a heat-generating device adjacent to the heatsink; and
a coolant channel formed in the component for conducting a coolant to dissipate heat generated by the heat-generating device, where the coolant channel is defined by stair-stepped sidewalls.

2. The heat dissipating component of claim 1, where:
the coolant channel is partially formed in the heatsink and partially formed in the heat-generating device.

3. The heat dissipating component of claim 1, where:
the coolant channel is entirely formed in the heatsink.

4. The heat dissipating component of claim 1, where:
the coolant channel is entirely formed in the heat-generating device.

5. The heat dissipating component of claim 1, where:
the stair-stepped sidewalls of the coolant channel define at least one sidewall portion that extends toward a center of the channel.

6. The heat dissipating component of claim 1, where:
the stair-stepped sidewalls of the coolant channel define at least one sidewall portion that extends away from a center of the channel.

7. The heat dissipating component of claim 1, where:
the heat-generating device and the heatsink are joined by solder or a thermally conductive adhesive.

* * * * *